(12) United States Patent
Ogonowsky

(10) Patent No.: US 10,192,478 B2
(45) Date of Patent: *Jan. 29, 2019

(54) LED DISPLAY WITH PATTERNED PIXEL LANDINGS AND PRINTED LEDS

(71) Applicant: Nthdegree Technologies Worldwide Inc., Tempe, AZ (US)

(72) Inventor: Brian D. Ogonowsky, Mountain View, CA (US)

(73) Assignee: NTHDEGREE TECHNOLOGIES WORLDWIDE INC., Tempe, AZ (US)

( * ) Notice: Subject to any disclaimer, the term of this patent is extended or adjusted under 35 U.S.C. 154(b) by 117 days.

This patent is subject to a terminal disclaimer.

(21) Appl. No.: 15/350,625

(22) Filed: Nov. 14, 2016

(65) Prior Publication Data

US 2017/0140701 A1 May 18, 2017

Related U.S. Application Data

(60) Provisional application No. 62/256,517, filed on Nov. 17, 2015.

(51) Int. Cl.
*H01L 21/00* (2006.01)
*G09G 3/32* (2016.01)
(Continued)

(52) U.S. Cl.
CPC ........... *G09G 3/32* (2013.01); *H01L 25/0753* (2013.01); *H01L 33/0079* (2013.01); *H01L 33/0095* (2013.01); *H01L 33/06* (2013.01); *H01L 33/32* (2013.01); *H01L 33/405* (2013.01); *H01L 33/486* (2013.01); *H01L 33/502* (2013.01); *H01L 33/54* (2013.01); *H01L 33/58* (2013.01); *H01L 33/62* (2013.01); *G06T 2207/20021* (2013.01); *G09G 2300/04* (2013.01);
(Continued)

(58) Field of Classification Search
None
See application file for complete search history.

(56) References Cited

U.S. PATENT DOCUMENTS 8,889,216 B2 * 11/2014 Ray ..................... H01L 27/3281
427/66
9,368,549 B1 * 6/2016 Oraw .................... H01L 27/156
(Continued)

*Primary Examiner* — Angel Roman
(74) *Attorney, Agent, or Firm* — Patent Law Group LLP; Brian D. Ogonowsky

(57) ABSTRACT

Pixel locations in an addressable display are defined by metal landings on a top surface of a flexible substrate, such as by depositing a metal film and etching the film. The substrate surface may be hydrophobic so that the hydrophobic surface is exposed between the metal landings. The substrate has conductive vias that connect the metal landings to traces on a bottom surface of the substrate for connection to addressing circuitry. LED ink is then blanket-printed over the top surface and cured to electrically connect bottom electrodes of the LEDs to the metal landings. LEDs that fall between the landings are ineffective. A dielectric layer is blanket-printed which exposes the top electrodes, and a transparent conductor layer is blanket-printed over the LEDs to connect all LEDs associated with an individual pixel location in parallel. Accordingly, all printed steps can be performed without any alignment.

15 Claims, 3 Drawing Sheets

(51) Int. Cl.
   *H01L 33/06* (2010.01)
   *H01L 33/32* (2010.01)
   *H01L 33/40* (2010.01)
   *H01L 33/00* (2010.01)
   *H01L 33/48* (2010.01)
   *H01L 33/62* (2010.01)
   *H01L 33/58* (2010.01)
   *H01L 33/54* (2010.01)
   *H01L 33/50* (2010.01)
   *H01L 25/075* (2006.01)

(52) U.S. Cl.
   CPC .................. *H01L 2933/005* (2013.01); *H01L 2933/0041* (2013.01); *H01L 2933/0058* (2013.01); *H01L 2933/0066* (2013.01); *H01L 2933/0083* (2013.01)

(56) References Cited

U.S. PATENT DOCUMENTS

| | | | |
|---|---|---|---|
| 9,837,390 B1* | 12/2017 | Sorensen | H01L 25/0753 |
| 2006/0008943 A1* | 1/2006 | Hahn | H01L 24/31 |
| | | | 438/107 |
| 2016/0380158 A1* | 12/2016 | Sasaki | H01L 33/483 |
| | | | 257/89 |
| 2017/0133558 A1* | 5/2017 | Sasaki | H01L 33/486 |
| 2018/0114775 A1* | 4/2018 | Ray | H01L 25/0655 |

* cited by examiner

LED DISPLAY WITH PATTERNED PIXEL LANDINGS AND PRINTED LEDS

CROSS-REFERENCE TO RELATED APPLICATIONS

This application claims priority to U.S. Patent Application Ser. No. 62/256,517 filed on Nov. 17, 2015, by Brian Ogonowsky, assigned to the present assignee and incorporated by reference.

FIELD OF THE INVENTION

This invention relates to addressable displays and, in particular, to a very thin and flexible display formed of printed microscopic light emitting diodes (LEDs).

BACKGROUND

It is known by the Applicant's previous work to print a conductor layer over a flexible substrate, followed by printing a monolayer of microscopic vertical LEDs over the conductor layer in the desired orientation so that, after curing, the bottom electrodes of the LEDs ohmically contact the conductor layer. A dielectric layer is then printed over the conductor layer, followed by printing a transparent conductor layer to contact the top electrodes of the LEDs and connect the LEDs in parallel. A layer of phosphor may be optionally printed over the LEDs to wavelength-convert the LED light. When a sufficient voltage is applied to the conductor layers, the LEDs emit light through the transparent conductor layer. Further detail of forming a light source by printing microscopic vertical LEDs, and controlling their orientation on a substrate, can be found in U.S. Pat. No. 8,852,467, entitled, Method of Manufacturing a Printable Composition of Liquid or Gel Suspension of Diodes, assigned to the present assignee and incorporated herein by reference.

This same printing technique can be used to print pixels comprising printing individual conductive pixel landings, such as by using screen printing with a mask to print metal ink, followed by printing the LEDs over the pixel landings using a corresponding print mask. Alternatively, the metal pixel pattern can be printed over the printed LEDs using the LED print mask. Flexography can also be used for printing the patterns. Another conductor layer connects all the LEDs in each pixel in parallel, and each pixel can be individually energized using an addressing circuit. Problems with such a method for forming a display include the difficulty of achieving precise registration of the metal ink pattern and the LED ink pattern, the inherent spreading out of the inks after printing, the lower quality of a printed metal layer vs. a conventional metal film, the difficulty of providing conductive traces from all the pixels to an addressing circuit, the difficulty in patterning ink for a very large display, and the inability to print small pixels.

Thus, what is needed is a simpler and more precise technique for forming an addressable display using microscopic printed LEDs.

SUMMARY

In one embodiment, a metal landing pixel pattern for LEDs is formed on a flexible substrate for an addressable display. The pixel pattern is not formed by printing but is formed by any suitable method used to pattern metal, such as laminating a thin metal film to the substrate and patterning the film. Such processes include wet etching, laser etching, lift-off, and other techniques. The metal film may be also formed by evaporation or other deposition techniques. Plating may also be used. Patterning the metal landings can be more precise than printing the metal landings using a conductive ink, and the metal will be of a higher quality. This technique can be performed on a large scale.

For cost, reliability, and other reasons, it is desired to form LEDs over the metal landing pixel pattern using an LED ink printing process. However, patterning the LEDs during the printing process to precisely match the existing pixel pattern is very difficult.

Rather than patterning the LEDs during printing in the present process, the LEDs are blanket-printed as a monolayer of LEDs over the entire metal landing pixel pattern. If the pixels have a spacing greater than the diameter of a single LED, the LED's bottom electrode will not short out the pixels. Only LEDs that directly land on a metal landing can be energized. Narrow spaces between landings result in very little waste of LEDs. The spaces may also contain a hydrophobic material, so LED ink printed in the spaces will be pulled into a pixel location by capillary action.

After the LED ink is cured, and the bottom electrodes of the LEDs electrically contact their respective metal landings, a thin dielectric layer is deposited to encapsulate the sides of the LEDs and expose the top electrodes, followed by depositing a transparent conductor layer over the tops of the LEDs, so all LEDs on a single metal landing form a single addressable pixel.

The substrate on which the metal landing pixel pattern is formed may be a thin flexible sheet of PET or PMMA. Alternately, the substrate may be rigid. Through-holes are initially formed in the substrate that correspond with the pixel pattern. The through-holes are filled with a conductive material to form vias. For example, if the metal landings are formed by evaporation, the metal fills the holes. Other techniques may also be used. The vias electrically connect the metal landings to a metal trace pattern on the back of the substrate leading to addressing circuitry. Therefore, no area on the front side of the substrate is used for addressing the pixels.

For a color display, the LEDs may all emit blue light and a red and green phosphor pattern can be printed over certain pixels to create addressable RGB pixels. Each pixel has a variable number of LEDs, but equal current to each pixel would cause the brightness per pixel to be the same.

Other embodiments are described.

BRIEF DESCRIPTION OF THE DRAWINGS

Elements that are similar or identical in the various figures are labeled with the same numeral.

DETAILED DESCRIPTION

The GaN-based micro-LEDs used in embodiments of the present invention are less than a third the diameter of a human hair and less than a tenth as high, rendering them essentially invisible to the naked eye when the LEDs are sparsely spread across a substrate. The sizes of the devices may range from about 1-200 microns across. This attribute permits construction of a nearly or partially transparent light-generating layer made with micro-LEDs. The number of micro-LED devices per unit area may be freely adjusted when applying the micro-LEDs to the substrate. A well dispersed random distribution across the surface can produce nearly any desirable surface brightness. Lamps well in excess of 10,000 cd/m$^2$ have been demonstrated by the assignee. The LEDs may be printed as an ink using screen printing, flexography, or other forms of printing. Further detail of forming a light source by printing microscopic vertical LEDs, and controlling their orientation on a substrate, can be found in U.S. Pat. No. 8,852,467, entitled, Method of Manufacturing a Printable Composition of Liquid or Gel Suspension of Diodes, assigned to the present assignee and incorporated herein by reference.

For a large high definition display of, for example, 3 meters across, having 1920 pixels in the horizontal direction, each pixel can be about 1.5 mm across. If the LEDs have a diameter of 50 microns, a practical maximum of about 20 LEDs can be in each pixel, although in a practical embodiment only a few LEDs per pixel are needed for sufficient brightness. The flexible display may even be billboard size and formed of interconnected tiles for ease of handling, where the pixel size is much larger.

Figure 1:
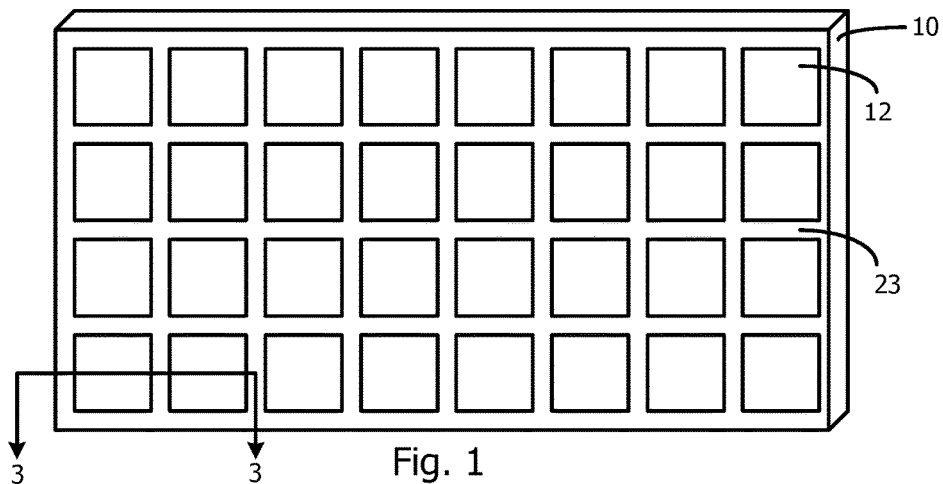
FIG. 1 illustrates a patterned reflective metal film, forming metal landings in a pixel pattern, over a top surface of a thin flexible substrate.

FIG. 1 illustrates the front surface of a thin, flexible substrate 10 having a reflective metal pattern formed over it creating metal landings 12 defining pixel locations. The area of each landing 12 can be any size depending on the size of the display and the desired resolution (e.g., full color, high definition). The areas between the landings 12 may be black to more effectively optically separate the pixels, or the entire substrate may be black. For full HD TV, there may be 1920×1080 full color pixels.

The substrate 10 may be a suitable polymer film, such as polycarbonate, PMMA, or PET, less than 200 microns thick and may be dispensed from a roll. The substrate 10 can be any size, since no vacuum processing is needed for fabrication of the display, and the processing may be performed using a conveyor system.

The metal landings 12 may be any suitable metal for attachment to the bottom electrodes of the LEDs, such as aluminum, nickel, gold, silver, copper, or an alloy. In one embodiment, a metal foil is laminated onto the substrate, or a metal layer is evaporated or otherwise deposited on the surface. In another embodiment, the landings may be formed of a conductive material that is not a metal. A photoresist may then be applied and patterned using any suitable means, such as photolithography. The unwanted metal (between the intended landings) is then etched away using, for example, a wet etch. A programmed laser may instead be used to ablate away the undesired metal portions. Many other processes are known for forming very precise metal patterns down to a few microns precision. The landings 12 may also be plated. Forming the metal landing pattern may use conventional techniques, so is inexpensive. This technique is more precise than printing the metal landings 12 using a conductive ink, due to the constraints of printing a pattern and the ink spreading somewhat before curing. The quality of the metal will typically be higher than that of a printed metal.

Prior to forming the metal landing pattern, the substrate 10 is provided with through-holes, aligned with each metal landing location. The through-holes may be filled in a process separate from the process used to form the metal landings 12 or filled at the same time that the metal landings 12 are formed, if the metal film is formed by deposition rather than lamination. The holes may be formed using a laser, stamping, or by etching. In one embodiment, the holes are filled with a conductive ink, and the ink is then cured.

In one embodiment, the substrate 10 has stamped in it the landing pixel pattern (as an array of holes), and the metal for forming the metal landings 12 is deposited over the substrate 10 and removed from the surface except within the stamped landing pixel pattern. Therefore, the deposited metal simultaneously forms the landing pixel pattern and the conductive vias. For example, the metal may be deposited over the substrate and into the holes as a liquid and then squeegeed off the top surface of the substrate, leaving only the metal ink in the holes. The metal ink is then cured. Any deposited metal may be further plated with another metal.

Figure 2:
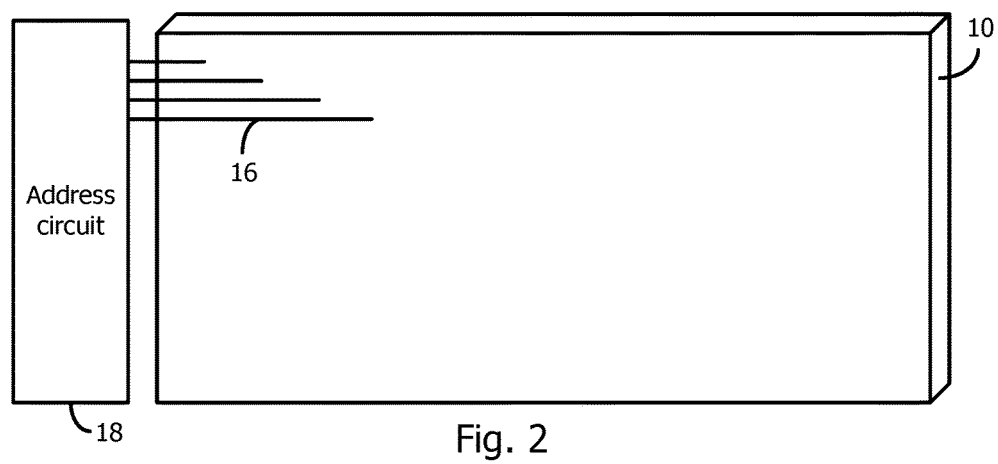
FIG. 2 illustrates the back surface of the substrate on which is formed thin metal traces leading to each of the metal landings via a through-hole in the substrate.

As shown in FIG. 2, the back surface of the substrate 10 has metal traces 16 formed on it using conventional techniques, such as the same techniques used to form the metal landings 12. The ends of the traces 16 contact the vias associated with each metal landing 12. The trace material may also form the vias by filling the through-holes. Only a few of the traces 16 are shown, and there is one trace 16 per landing 12, depending on the addressing scheme. Since the traces 16 are formed on the back surface of the substrate 10, there is a lot of space to route the traces 16 irrespective of the pixel locations. The traces 16 terminate at an address circuit 18 that applies a voltage to any pixel location to illuminate that pixel to any brightness level.

Figure 4:
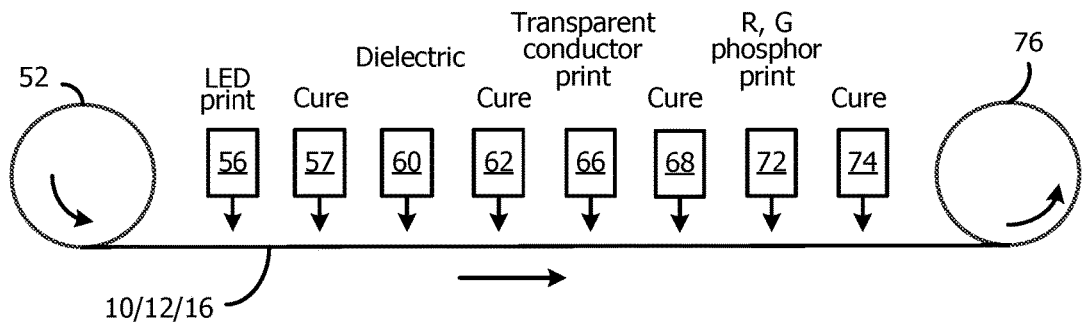
FIG. 4 illustrates a roll-to-roll process for creating the full color addressable display of FIG. 3.

The substrate 10 with the metal patterns on both surfaces is then supplied on a roll to complete the fabrication process, as shown in FIG. 4, described later.

An LED ink is prepared for blanket-printing over the entire metal landing 12 pattern.

Figure 3:
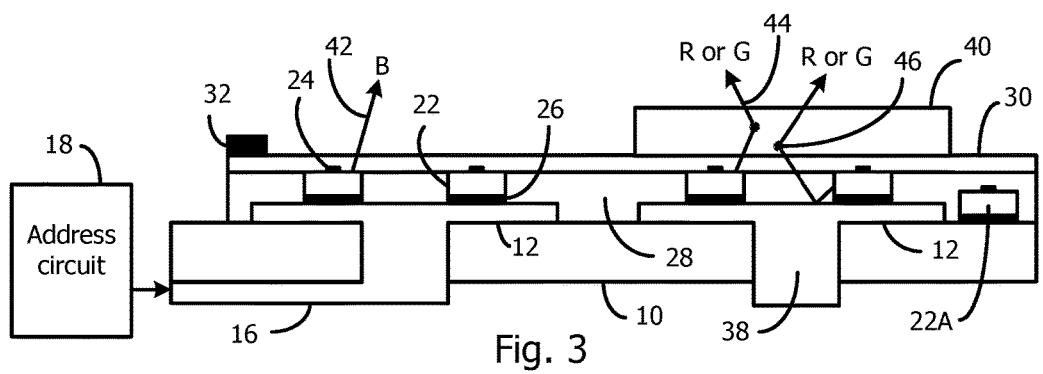
FIG. 3 is a cross-sectional view along line 3-3 in FIG. 1 showing LEDs blanket-printed over the entire metal landing pattern and cured, along with the bottom traces, conductive vias, top transparent conductor layer, and phosphor areas for creating red and green pixels.

FIG. 3 is a cross-section of a small portion of the display along the line 3-3 in FIG. 1, showing microscopic LEDs 22 printed over the metal landing 12 pattern.

In one embodiment, an LED wafer, containing many thousands of vertical LEDs, is fabricated with a top metal anode electrode 24 for each LED 22. The bottom metal cathode electrode 26 for each LED is reflective to cause almost all the LED light to escape from the top of the LED 22. There is also some side light, depending on the thickness of the LED 22. The anode and cathode surfaces may be opposite to those shown. Each vertical LED 22 (VLED) may include standard semiconductor GaN layers, including an n-layer, an active layer (e.g., multi-well layers), and a p-layer. The LED 22 is a heterojunction LED.

The LEDs are completely formed on the wafer, including the anode and cathode metallizations, by using one or more carrier wafers, bonded to the LED wafer by an adhesive layer, during the processing and removing the growth substrate to gain access to both LED surfaces for metallization. After the LEDs are formed on the wafer, trenches are photolithographically defined and etched in the front surface of the wafer around each LED, to a depth equal to the wafer thickness, so that each LED typically has a diameter of less than 50 microns and a thickness of about 2-8 microns, making them essentially invisible to the naked eye. A preferred shape of each LED is hexagonal. The trench etch exposes the underlying wafer bonding adhesive. The bonding adhesive is then dissolved in a solution to release the LED dies from the carrier wafer. Singulation may instead be performed by thinning the back surface of the wafer until the LEDs are singulated. The LEDs 22 of FIG. 3 result, depending on the metallization designs. The microscopic LEDs are then uniformly infused in a solvent, including a viscosity-modifying polymer resin, to form an LED ink for printing, such as screen printing or flexographic printing.

The LEDs may instead be formed using many other techniques and may be much larger or smaller.

The LEDs 22 are then blanket-printed as a monolayer over the entire substrate 10 area containing the metal landings 12, such as by flexography or by screen printing with a suitable mesh to allow the LEDs to pass through and control the thickness of the layer. Because of the comparatively low concentration, the LEDs 22 will be printed as a loose monolayer and be fairly uniformly distributed over the substrate 10 surface. Any other suitable deposition process may be used. In the example of FIG. 3, the top anode electrodes 24 are formed to be relatively tall so that the LEDs 22 orient themselves in the direction shown in FIG. 3 by taking the rotational orientation of least resistance when settling on the surface of the substrate 10 and metal landings 12. By proper construction of the top electrode, over 90% of the LEDs 22 can be oriented with their anodes up. In this instance, the LEDs may be driven with a DC voltage with little loss of light. It is also possible to print the LEDs with approximately 50% of them pointed "up" and approximately 50% pointed "down" and drive them with an AC voltage. Any light emission in a downward direction may be reflected toward the light exit window of the display.

The solvent is then evaporated by heat using, for example, an infrared oven. After curing, the bottom electrodes 26 of the LEDs 22 remain attached to the underlying metal landings 12 with a small amount of residual resin that was dissolved in the LED ink as a viscosity modifier. The adhesive properties of the resin and the decrease in volume of resin underneath the LEDs 22 during curing press the bottom electrode 26 against the underlying metal landing 12, making ohmic contact with it.

Note that, since the LED ink is not patterned, some LEDs, such as LED 22A, will land between the metal landings 12 so cannot be energized. Since the metal landings 12 can be formed close together, there is very little waste of LEDs 22. The space between the landings 12 should be greater than the width of the LEDs 22 to prevent the bottom electrode 26 of an LED 22 from shorting two landings together.

In another embodiment, a hydrophobic material may be deposited on the substrate 10 between the metal landings 12, where the hydrophobic material causes the LED ink to dewet (or be repelled) off the areas between the landings 12. Such hydrophobic material 23 is shown in FIG. 1 between the landings 12. Therefore, close to 100% of the LEDs 22 will be deposited over a metal landing 12. If a hydrophobic material is used, the LED 22A in FIG. 3 would not be present between the landings 12. Such hydrophobic materials are commercially available for a variety of solutions that could be used for the LED ink. The hydrophobic material may be printed or formed using photolithography.

In another embodiment, the hydrophobic material is deposited over the entire substrate 10 surface, or the substrate 10 itself is hydrophobic, and the metal landing pattern is deposited over the hydrophobic surface and then patterned. Therefore, the hydrophobic material 23 will be self-aligned with the metal landings 12.

The hydrophobic material 23, or another material between the landings 12, may be black so as to better optically separate the pixels and reduce cross-talk by any light conduction through the substrate 10.

A transparent dielectric layer 28 is then printed over the surface to encapsulate the LEDs 22 and additionally secure them in position. The ink used in the dielectric layer 28 is designed to pull back or de-wet from the upper surface of the LEDs 22 during curing to expose the top anode electrodes 24.

A top transparent conductor layer 30 is then blanket-printed over the dielectric layer 28 and LEDs 22 to electrically contact the top electrodes 24 and is cured in an oven appropriate for the type of transparent conductor being used. Examples of a printable transparent conductor include ITO and sintered silver nano-wires. All LEDs 22 within a single pixel are connected in parallel, and the number of LEDs 22 per pixel will vary somewhat. Even if the number of LEDs 22 per pixel varied, the brightness of each pixel will be the same if the same current is supplied to each pixel. By blanket-printing the LED ink, the dielectric layer 28, and transparent conductor layer 30, there are no masks used for the printing processes, and all the pixel locations are defined solely by the metal landings 12. Therefore, there is no alignment of printed patterns required.

Metal bus bars 32 are then printed along opposite edges of the transparent conductor layer 30 and electrically terminate at anode leads (not shown). These bus bars 32 may be considered to have a vertical orientation if the display is held vertically.

Narrow metal runners (outside the plane of the cross-section of FIG. 3) may then be printed in the horizontal direction between the vertical bus bars 32 to reduce the resistance across the transparent conductor layer 30. The metal runners may be opaque and be routed over the spaces between the metal landings 12 to help optically define the pixel locations. The bus bars 32 will ultimately be connected to a power source using a connector appropriate for the particular application.

The points of connection between the bus bars 32 and the power source leads may be at opposite corners of each bus bar 32 for uniform current distribution along each bus bar 32 or may be at multiple points along each bus bar 32 to reduce the voltage drop across the bus bar 32, for large light sheets, to improve electrical efficiency.

If a suitable voltage differential is applied to the anode and cathode leads of LEDs 22 in a single pixel, all the LEDs 22 in that pixel with the proper orientation will be illuminated. Multiple pixels, including all pixels, can be simultaneously energized, depending on the addressing scheme. The pixels may also be energized by raster scanning using time-division multiplexing. Any type of addressing may be used.

FIG. 3 also shows the conductive vias 38 extending through the substrate 10 for each metal landing 12. Traces 16 form a conductive path between the vias 38 and an address circuit 18 for energizing LEDs within a pixel. Only one of the traces 16 is shown in the cross-section of FIG. 3.

In another embodiment, if there is sufficient room between the landings 12, all traces 16 may be routed on the top surface of the substrate 10 between the landings 12. This approach avoids the need for the conductive vias 38.

FIG. 3 also shows a red or green phosphor 40 deposited over a pixel. If the LEDs 22 are GaN types and emit blue light, red and green phosphor areas enable selected pixels to emit red, green, or blue light for a full color display. An RGB pixel group may be formed by adjacent pixels. There may be multiple pixels of a same color in each RGB pixel group for the proper color component balance.

All light exits the top of the display as shown by the blue light ray 42 and the red or green light ray 44. The light ray 44 is shown being emitted by a phosphor particle 46. Quantum dots may also be used for wavelength conversion.

A black material may be printed between pixels to reduce cross-talk between pixels.

The entire display can be formed to have a thickness less than 1 mm.

Figure 5:
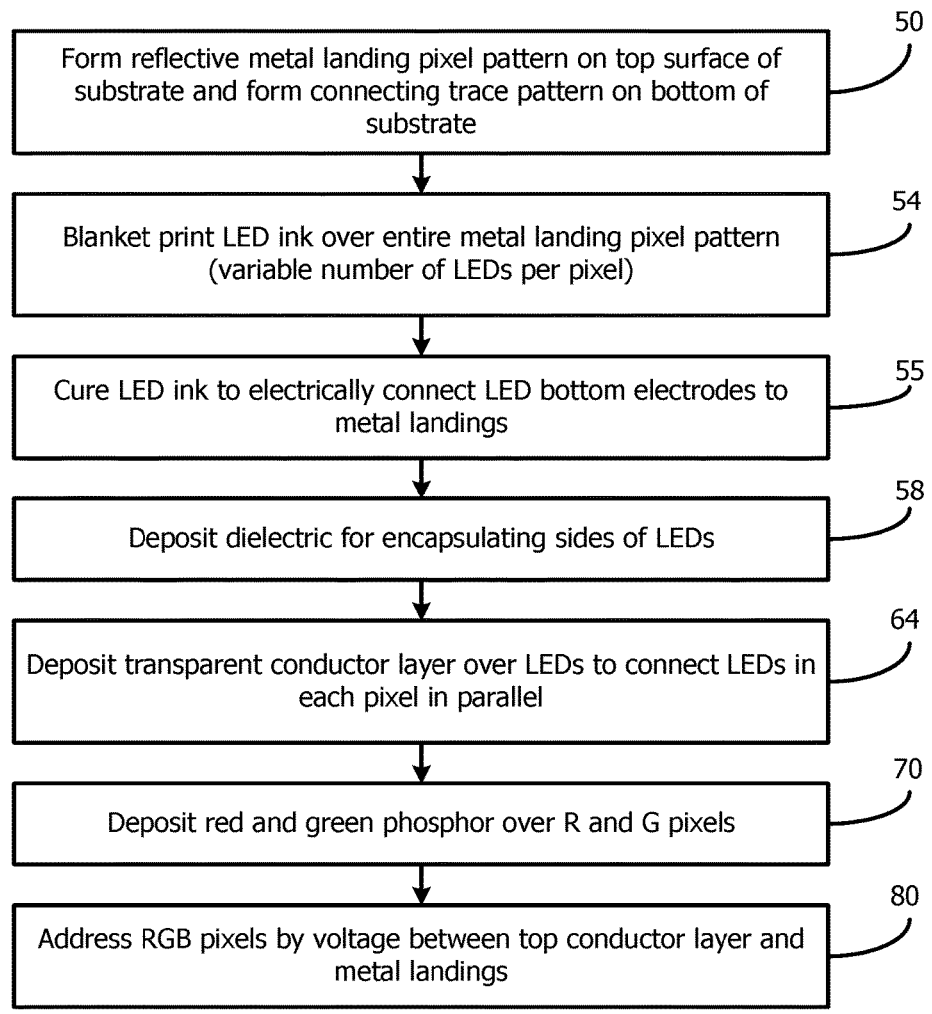
FIG. 5 is a flowchart identifying various steps used to form the display of FIG. 3.

FIG. 4 illustrates a roll-to-roll process for forming the display of FIG. 3, and FIG. 5 is a flowchart identifying steps used in the fabrication process. All steps may be performed under atmospheric conditions to produce a very low-cost display screen.

In step 50 of FIG. 5, a reflective metal landing pixel pattern is formed on a flexible substrate 10 where the substrate 10 may be provided on a roll 52 (FIG. 4). The substrate 10 has through holes filled with a conductive material and a trace pattern on the back surface for addressing the pixels. A hydrophobic material (relative to the LED ink) may be located between the metal landings 12. The substrate 10 may have any width.

In steps 54 and 55, the LED ink is blanket-printed, at station 56 in FIG. 5, over the substrate 10 and cured, at station 57, to cause the bottom electrodes of the LEDs to electrically contact the metal landings. In a practical embodiment, there may be 1-10 LEDs per metal landing.

In step 58, a dielectric is deposited at station 60 and cured at station 62. The dielectric is formed to encapsulate the sides of the LEDs and expose the top electrodes.

In step 64, a transparent conductor layer is blanket-deposited over all the LEDs, at station 66, and cured, at station 68, to connect all the LEDs in each pixel in parallel.

In step 70, red and green phosphor dots are printed over those pixels that are to emit red and green light, assuming the LEDs emit blue light, at station 72, and cured, at station 74. In another embodiment, the red and green phosphor dots may be printed on a transparent lamination layer, with clear "dots" for the blue pixels, and the lamination layer is aligned with the substrate 10 and adhered to it. In another embodiment, all the LEDs may emit UV, and blue phosphor dots are used to create the blue pixels.

The processed substrate 10 may then be cut or supplied on a take up roll 76 for further processing.

Any connectors are then provided to connect to the traces on the back surface of the substrate 10 for addressing the pixels.

In step 80, the completed display is then connected to an addressing circuit, receiving signals from an image processor, to supply the desired voltage/current to the various RGB pixels to create a full color, flexible display of any size, such as billboard size. For very large displays, an array of display tiles may be interconnected for ease of handling. The display may be static to display an advertisement, or may be dynamic, such as for a large display for a stadium.

If desired, light diffusion layers or brightness enhancement layers may be printed on or laminated on the display's exit surface to modify the light emission pattern and avoid glare. A protective layer may also be provided.

For very large displays, such as a freeway billboard size of 14 feet×48 feet, it is impractical to form a single large array of pixels using the techniques described above. Therefore, a scheme is required for energizing pixels in an array of mid-size tiles to form a unified image in a large display.

It is also impractical to electrically connect the traces 16 (FIG. 2) on the back of one tile to the traces on the back of another tile due to the large number of traces for a tile of, for example, 200×200 pixels. Therefore, it is most practical for each tile in an array of tiles to be independently powered and addressed. This approach will simplify the installation of the tiles and the addressing.

Figure 6:
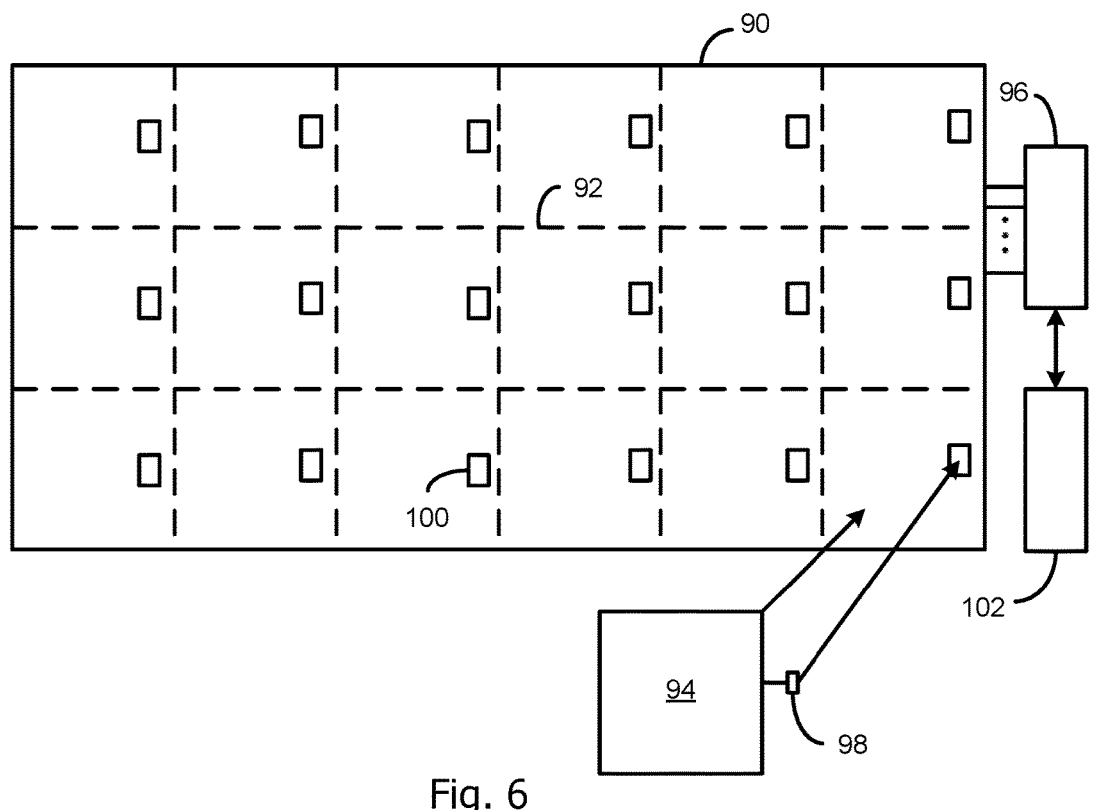
FIG. 6 illustrates an adhesive mounting structure for an array of individual tiles, where each tile is identical and similar to that of FIGS. 1-3.
Figure 7:
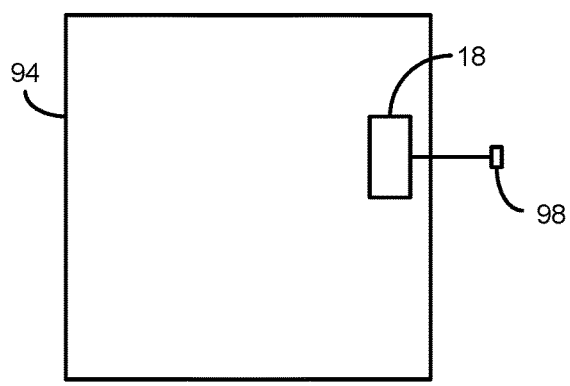
FIG. 7 illustrates the back of a single tile showing an on-tile decoder and a pluggable connector for attachment to another connector provided by the mounting structure of FIG. 6.

FIGS. 6 and 7 illustrate a viable scheme for forming a large display using identical tiles, such as those described with respect to FIGS. 1-5.

In the simplified example of FIG. 6, it is assumed that a large display can be formed using a 3×6 array of identical tiles. The size of each tile can be optimized and standardized for a variety of display sizes. Therefore, the user can simply be provided any number of tiles from the tile manufacturer and connect them to form a customized display. There is no limit on the size of the display.

A display substrate 90 is provided that may be formed of a number of sections for simplifying handling and installation. For example, the substrate 90 may be formed of sections of plywood, plastic sheets, a thin film, etc. The substrate 90 may be an existing billboard support surface traditionally used to mount a printed image. The intended positions of the tiles are shown by the dashed line grid 92.

The top surface of the substrate 90 or the back surface of each tile 94 may be a weak, tacky adhesive. The tile 94 is shown being designated for the bottom right position on the substrate 90.

FIG. 7 illustrates the back surface of the tile 94, where an on-board addressing circuit 18 is connected to the traces 16 (FIG. 2) on the back of the tile 94, and the traces are connected to the various pixels on the front surface of the tile 94. The address circuit 18 may be a serial decoder that receives a serial bit stream from a master controller 96 (FIG. 6), such as using USB technology. Power can also be separately supplied to each tile 94 using standard USB technology, where the standard USB connector supplies power and the serial data. By mounting the address circuit 18 directly on the back of the tile 94, where the tile 94 acts like a flexible printed circuit board, the delicate traces 16 may be reliably connected to the address circuit 18 terminals during fabrication of the tiles 94 rather than by the user.

Multiple connectors may be used to supply sufficient power to the LEDs in the pixels. However, since not all pixels may be on at the same time (using time division multiplexing), the power to a single tile 94 at any one time may be less than 500 mA.

The address circuit 18 will generally be a packaged integrated circuit with a serial input port and output ports connected to the various traces on the back of a tile to individually address any pixel. Additional circuits may be used to address and provide sufficient power to the pixels, such as controllable current sources and video RAM circuits.

Each tile 94 has a connector 98, such as one or more USB connectors, that connects to a connector 100 from the substrate 90 for each tile position. For example, the connector 100 may be a recessed fixed connector that supplies power (e.g., 5 volts) and the serial addressing data. Alternately, the connectors 100 may be attached to wires on the back of the substrate 90, where the connectors 100 can be pulled through holes for connection to the tiles 94 and then pushed back into the holes so that the mounting surface for the tiles 94 remains flat. Each address circuit 18 may include a controllable current source, or such current sources may be separate circuits. Each current source is controlled by the serial data to supply the proper current to the addressed pixel to control the brightness of that pixel.

All the connectors 100 are routed via wires to the master controller 96 that receives data from an image processing unit 102, such as a standard computer, for supplying the serial data to each of the connectors 100 for creating the unified large image. The master controller 96 receives the image data and divides the image into sections to be displayed by the individual tiles 94. Alternatively, the image processing unit 102 may divide the image into sections for each tile 94. The master controller 96 then controls each tile 94 independently to produce the desired image. All the tiles may simultaneously energize one or more pixels at any suitable frequency to avoid flicker. Due to the large size of the display, raster scanning of the entire array of pixels (i.e., one pixel at a time) may not be sufficient to achieve the desired brightness or avoid flicker. The image data provided to the master controller 96 may be generated remotely and transmitted to the system via the Internet or other wireless technique. The master controller 96 may be formed of various ICs on a mother board in a computer.

In another embodiment, the same serial data is sent to every decoder for all the tiles 94, and the decoder determines whether the serial data applies to that tile. If the serial data applies to that tile, designated by an address code in the serial data, the decoder will cause the addressed pixel in that tile to be energized. This technique can simplify with wiring to each tile by the substrate since a bus may be used.

Accordingly, any size display can be created using standard size tiles that are independently connected and controlled by a master controller.

Although the embodiments have been described as addressable displays, the structure may be used to provide white light illumination, where the color temperature may be selected by controlling the currents to the red, green, and blue pixels.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method of forming an illuminating device comprising:
   providing a substrate having an array of conductive landings forming pixel locations on a first surface of the substrate, the substrate further having conductive traces electrically connected to associated ones of the conductive landings;
   blanket-printing an ink containing inorganic light emitting diode (LED) dies over the array of conductive landings, the ink being an LED ink, the LED dies comprising singulated dies having at least an n-type layer, a p-type layer, a top electrode, and a bottom electrode;
   curing the LED ink such that the bottom electrodes of the LED dies electrically contact an underlying conductive landing; and
   forming a transparent conductor layer overlying the LED dies to electrically contact the top electrodes of the LED dies, wherein the LED dies overlying an individual conductive landing are connected in parallel and are energized by a voltage across the transparent conductor layer and an associated trace connected to the individual conductive landing.

2. The method of claim 1 further comprising the substrate having conductive through-holes associated with the conductive landings, wherein the conductive traces are formed on a second surface of the substrate electrically connected to associated ones of the conductive landings via the conductive through-holes.

3. The method of claim 1 further comprising providing a hydrophobic material between the conductive landings on the first surface of the substrate to repel the LED ink between the conductive landings.

4. The method of claim 1 wherein the steps of blanket-printing the ink and curing the ink result in a variable number of LED dies electrically connected to each conductive landing.

5. The method of claim 1 further comprising connecting the traces to addressing circuitry for selectively energizing pixel locations.

6. The method of claim 1 wherein the illuminating device is an addressable display.

7. The method of claim 1 wherein the substrate is initially provided on a roll.

8. The method of claim 1 wherein all steps are performed under atmospheric conditions.

9. The method of claim 1 wherein some of the LED dies are located between the conductive landings and are not energizable.

10. The method of claim 1 further comprising forming metal runners across the transparent conductor layer.

11. The method of claim 1 wherein the LED dies emit blue light, the method further comprising providing at least red and green wavelength conversion materials over selected pixel locations so as to provide red, green, and blue pixels.

12. The method of claim 1 wherein the LED dies are microscopic.

13. The method of claim 1 wherein the step of providing the substrate having the array of conductive landings forming pixel locations comprises depositing a metal film over the substrate and etching the film to form the conductive landings.

14. The method of claim 1 wherein the step of providing the substrate having the array of conductive landings forming pixel locations comprises depositing a metal within holes formed in the substrate.

15. The method of claim 14, wherein the conductive traces are formed on a second surface of the substrate electrically connected to associated ones of the conductive landings via the metal within the holes formed in the substrate.

* * * * *